United States Patent
Derksen

(10) Patent No.: US 6,891,725 B2
(45) Date of Patent: May 10, 2005

(54) SYSTEM AND METHOD FOR IMPROVED MOTOR CONTROLLER

(75) Inventor: James Derksen, Bloomingdale, IL (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 263 days.

(21) Appl. No.: 10/252,643

(22) Filed: Sep. 23, 2002

(65) Prior Publication Data

US 2004/0056631 A1 Mar. 25, 2004

(51) Int. Cl.⁷ ................................................ H05K 7/20
(52) U.S. Cl. .................... 361/704; 361/690; 361/703; 174/16.1; 174/16.3; 165/80.3; 165/185
(58) Field of Search ................................ 361/690, 695, 361/703, 705, 707–712, 715–719; 165/80.3, 185, 104.33; 174/16.3; 62/259.2

(56) References Cited

U.S. PATENT DOCUMENTS

| | | | | |
|---|---|---|---|---|
| 4,060,847 A | * | 11/1977 | Penrod | 361/705 |
| 4,769,557 A | | 9/1988 | Houf et al. | 307/147 |
| 5,305,185 A | * | 4/1994 | Samarov et al. | 361/704 |
| 5,497,289 A | * | 3/1996 | Sugishima et al. | 361/709 |
| 5,543,659 A | | 8/1996 | Hosen | 257/692 |
| 5,666,268 A | | 9/1997 | Rix et al. | 361/692 |
| 5,699,609 A | | 12/1997 | Wieloch | 29/830 |
| 6,147,869 A | * | 11/2000 | Furnival | 361/719 |
| 6,282,092 B1 | * | 8/2001 | Okamoto et al. | 361/704 |
| 6,320,776 B1 | * | 11/2001 | Kajiura et al. | 363/141 |
| 6,411,514 B1 | * | 6/2002 | Hussaini | 361/704 |
| 6,441,520 B1 | * | 8/2002 | Grant | 310/68 R |
| 6,459,586 B1 | * | 10/2002 | Miller et al. | 361/719 |
| 6,573,616 B2 | * | 6/2003 | Yamane | 307/10.1 |
| 6,625,024 B2 | * | 9/2003 | Mermet-Guyennet | 361/700 |

* cited by examiner

Primary Examiner—Boris Chervinsky

(57) ABSTRACT

A modular motor controller family comprises a housing. Solid state switches are selected from one of plural switch sizes for controlling a desired voltage and current range. The switches are mounted in the housing for connection between an AC line and motor terminals for controlling application of AC power to the motor. A logic circuit board is mounted in the housing including logic circuitry for commanding operation of the solid state switches independent of the selected switch size. An interface circuit board selected from one of plural configurations is mounted in the housing and includes interface circuitry connected between the logic circuitry and the solid state switches. The interface circuitry is selected to interface with the selected switch size according to the desired voltage and current range.

11 Claims, 13 Drawing Sheets

US 6,891,725 B2

SYSTEM AND METHOD FOR IMPROVED MOTOR CONTROLLER

CROSS REFERENCE TO RELATED PATENT APPLICATIONS

The present U.S. Patent Application has at least one common inventor as U.S. patent application Ser. No. 10/252,636 entitled "System and Method for Motor Controller with a Reversible Housing Base", (2002P14790US), and is filed with the U.S. Patent and Trademark Office concurrently on Sep. 23, 2002, the entirety of which is incorporated herein by reference.

FIELD OF THE INVENTION

This invention relates to a motor controller and more particularly, a system and method for an improved motor controller.

BACKGROUND OF THE INVENTION

Solid state starters/controllers have found widespread use for controlling application of power to an AC induction motor. The conventional starter/controller, referred to hereinafter as simply a controller, uses solid state switches for controlling application of AC line voltage to the motor. The switches may be thyristors, such as silicon controlled rectifiers (SCRs) or triacs. The controller typically includes heat sinks associated with the SCR's for dissipating heat. A housing surrounds the SCRs. The housing may support a set of bus bars which carry current into and out of the controller. Controllers come in many different configurations that have different sizes of SCRs and bus bars to accommodate different current requirements. The size differences relate to current capacity and also physical size and usually require different housing parts to fit with each size.

Control of the SCRs is provided by a control circuit provided on a circuit board. The control circuit may include logic circuitry for commanding operation of the solid state switches and interface circuitry connected between the logic circuitry and the solid state switches. The logic circuitry may be identical for all of the different configurations. Instead, software may vary from configuration to configuration. Conversely, the interface circuitry may be unique to the voltage and current requirements of the SCRs being driven. Consequently, different circuit boards are required for each different configuration owing to the differences in interface circuitry. As a result, a manufacturer typically designs multiple different circuit boards resulting in higher costs and higher inventory requirements.

Additionally, the controller, in use, is generally mounted to a control panel. To do so, a sheet metal base plate is mounted to the heat sink. The sheet metal base plate is in turn mountable to the control panel. Further, the control circuit frequently includes user actuable switches for configuring operation of the controller. The switches are actuated by actuators moveably mounted to the housing. All of these different design configurations require use of multiple parts, again adding to inventory and thus manufacturing costs.

The present invention is directed to improvements in motor controller design.

SUMMARY OF THE INVENTION

In accordance with the invention there is provided an improved motor controller design that reduces manufacturing costs and decreases inventory requirements.

In accordance with one aspect of the invention there is disclosed a motor controller comprising solid state switches. A unitary heat sink includes a plate mounting the solid state switches, a plurality of fins extending from the plates, and mounting feet operatively associated with the plate for mounting the motor controller directly to an external control panel, in use. A housing is mounted to the heat sink for enclosing the solid state switches.

It is a feature of the invention that the heat sink comprises an extruded aluminum heat sink.

It is another feature of the invention that the mounting feet extend outwardly from outer edges of select ones of the fins.

It is a further feature of the invention that the heat sink includes a plurality of parallel fins extending perpendicular from the plate opposite the solid state switches and wherein the mounting feet extend outwardly from outer edges of outer most ones of the fins, parallel with the plate.

It is disclosed in accordance with another aspect of the invention a motor controller comprising a housing. Solid state switches of a select size for controlling a desired voltage and current range are mounted in the housing. A control circuit mounted in the housing controls operation of the solid state switches. The control circuit comprises a first circuit board and a second circuit board. The first circuit board includes logic circuitry for commanding operation of the solid state switches. The second circuit board includes interface circuitry connected between the logic circuitry and the solid state switches. The interface circuit is selected to interface with the select size solid state switches according to the desired voltage and current range.

It is a feature of the invention that the logic circuitry comprises a processor and memory circuit. The interface circuitry comprises sensing circuits and snubber circuits.

There is disclosed in accordance with another aspect of the invention a modular motor controller family comprising a housing. Solid state switches are selected from one of plural switch sizes for controlling a desired voltage and current range. The switches are mounted in the housing for connection between an AC line and motor terminals for controlling application of AC power to the motor. A logic circuit board is mounted in the housing including logic circuitry for commanding operation of the solid state switches independent of the selected switch size. An interface circuit board selected from one of plural configurations is mounted in the housing and includes interface circuitry connected between the logic circuitry and the solid state switches. The interface circuitry is selected to interface with the selected switch size according to the desired voltage and current range.

In one aspect of the invention the logic circuit includes user actuable switches and the housing includes a one piece cover having integral switch actuators. The cover may comprise a molded plastic cover.

In accordance with another aspect of the invention a wireless interface module is mountable to the housing for connection to the logic circuitry. The wireless interface module comprises a two piece enclosure, the two pieces being identical in construction. Each enclosure piece includes a foot to prevent improper installation of the interface module on the housing and wherein the foot on one of the enclosure pieces is removed prior to mounting the wireless interface module on the housing.

There is disclosed in accordance with a further aspect of the invention the motor controlling comprising a housing and solid state switches mounted in the housing. A control circuit is mounted in the housing for commanding operation of the solid state switches. A wireless interface module is removably mounted to the housing for connection to the control circuit comprising a two piece enclosure. The two pieces are identical in construction.

Further features and advantages of the invention will be readily apparent from the specification and from the drawings.

DETAILED DESCRIPTION OF THE INVENTION

Figure 1:
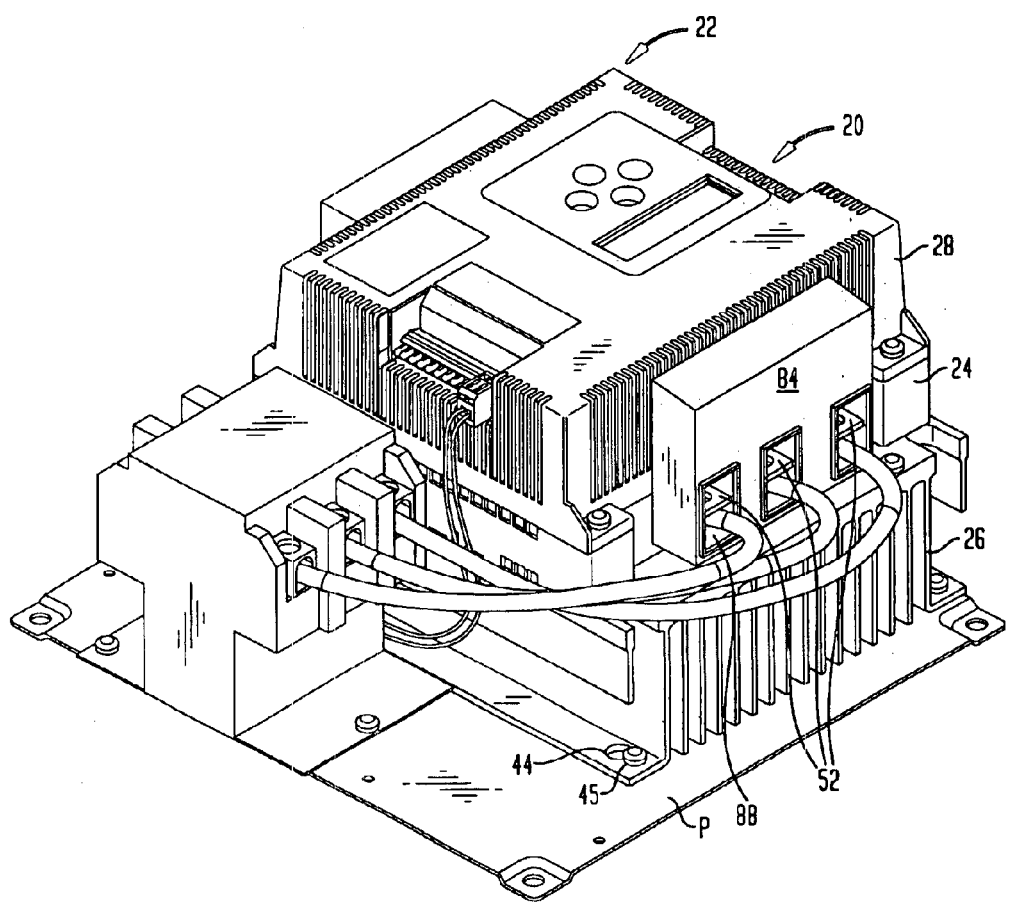
FIG. 1 is a perspective view of a motor controller in accordance with the invention mounted to a control panel.

Referring initially to FIG. 1, a motor controller 20 in the form of a solid state starter/controller 20 is illustrated. Particularly, design of the motor controller 20 in accordance with the invention reduces manufacturing costs and inventory requirements. One application for the controller 20 is as an elevator starter. The motor controller 20 may be used to drive a pump for an hydraulic elevator. Each time movement of an elevator car is commanded, then the motor controller 20 must start the elevator motor until it reaches operating speed and then operate in a run mode. Such a motor controller 20 may only be used for the up direction as gravity may be used for the down direction.

Figure 2:
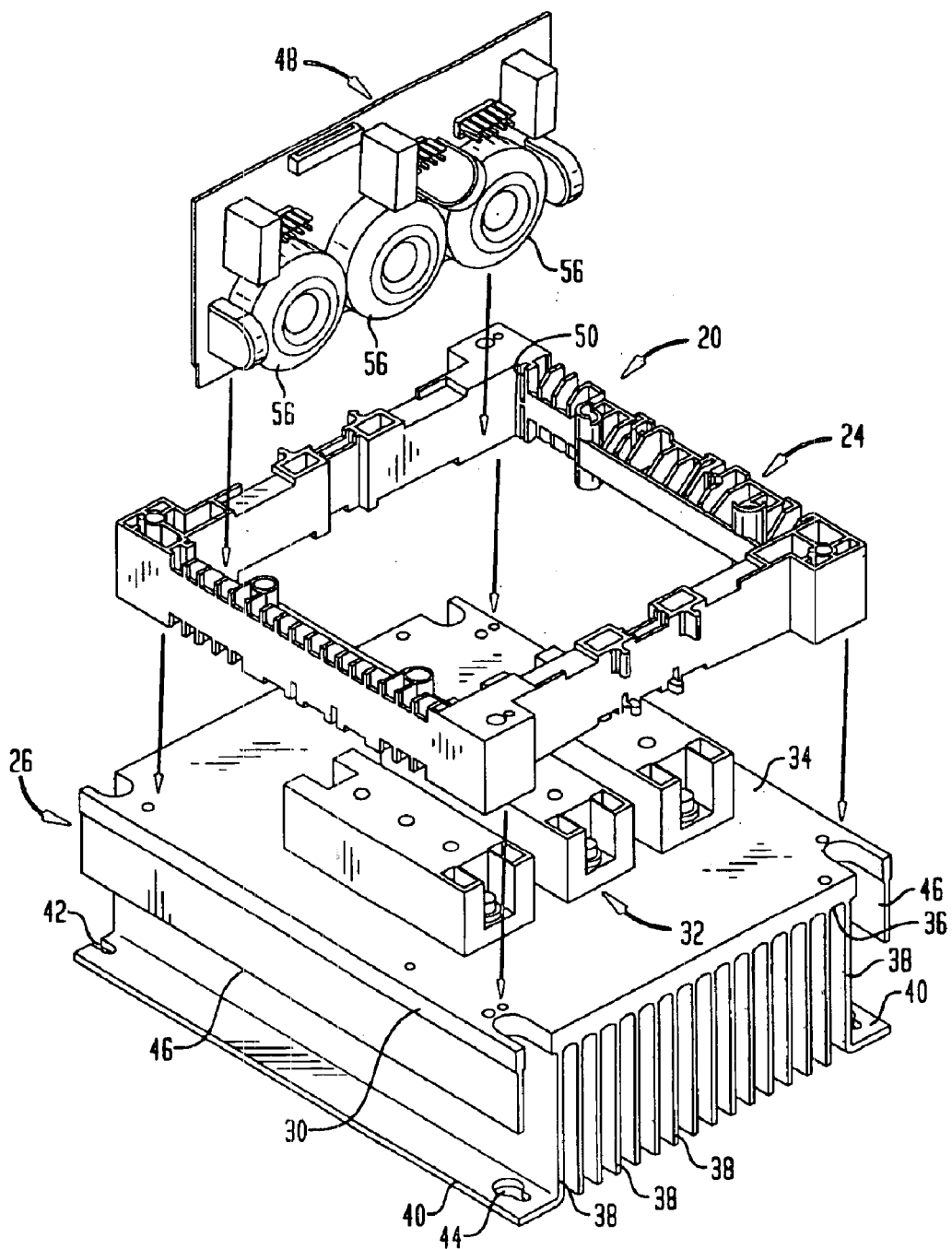
FIGS. 2–6 sequentially illustrate a method of assembling the motor controller of FIG. 1.

The motor controller 20 comprises a housing 22 including a housing base 24, a heat sink 26 and a cover 28. Referring also to FIG. 2, the heat sink 26 comprises a planar plate 30. The motor controller 20 includes a plurality of solid state switches 32 in the form of thyristors, such as back to back connected silicon controlled rectifier (SCR) pairs. For simplicity herein, the SCR pairs are referred to as simply SCRs. Triacs could also be used. The SCRs 32 are mounted to the plate 30. The SCRs 32 control application of three phase AC line voltage to a three phase motor. As is apparent, a different number of SCRs 32 could be used to control different numbers of phases, as is apparent to those skilled in the art.

The motor controller 20 is intended to satisfy different current control requirements. As such, the SCRs 32 may be of different sizes. The size differences relate to current capacity and also physical size. Different size SCRs require different bus bar sizes for connection to supply line terminals and motor terminals. The present application relates improvements in design of various parts, as described below, to minimize use of different parts to provide a family of motor controllers.

Referring particularly to FIG. 2, the heat sink 26 is of one piece aluminum construction. In the illustrated embodiment of the invention, the heat sink 26 is formed as an aluminum extrusion. However, the heat sink 26 could be formed of other materials, as is apparent. The plate 30 includes a top surface 34 and a bottom surface 36. The top surface 34 is planar and receives the SCRs 32. A plurality of parallel fins 38 extend downwardly from the bottom surface 36. Mounting feet 40 extend outwardly in opposite directions from outer most ones of the fins 38. The mounting feet 40 extend the length of the outer most ones of the fins 38 and include a notch 42 a lower end and a key shaped opening 44 at an upper end. As used herein, the term upper and lower refers to the orientation in which the motor controller 20 is generally mounted in a control panel. Particularly, the openings 44 would be used to mount the heat sink 26 and thus motor controller 20 onto screws 45 of a control panel P and then drops downwardly. The screws can then be tightened with additional screws inserted through the lower notches 42. As illustrated, the plate 30 extends outwardly to the edges of the opposite mounting feet 40. Shorter fins 46 extend downwardly from opposite edges of the plate 30.

The housing base 24 is positioned on the heat sink top surface 34 as generally indicated by arrows in FIG. 2. As such, the housing base 24 surrounds the SCRs 32. An interface circuit board 48 is received in channel 50 formed in the housing base 24. The interface circuit board 48 includes interface circuitry, as described below, for interfacing with the SCRs 32. Particularly, as described in the copending application filed concurrently herewith, the specification of which is incorporated by reference hereinabove, the SCRs 32 are selected from one of plural switch sizes. The interface circuitry on the interface circuit board 48 is selected to interface with the selected switch size according to the desired voltage and current range.

Figure 3:
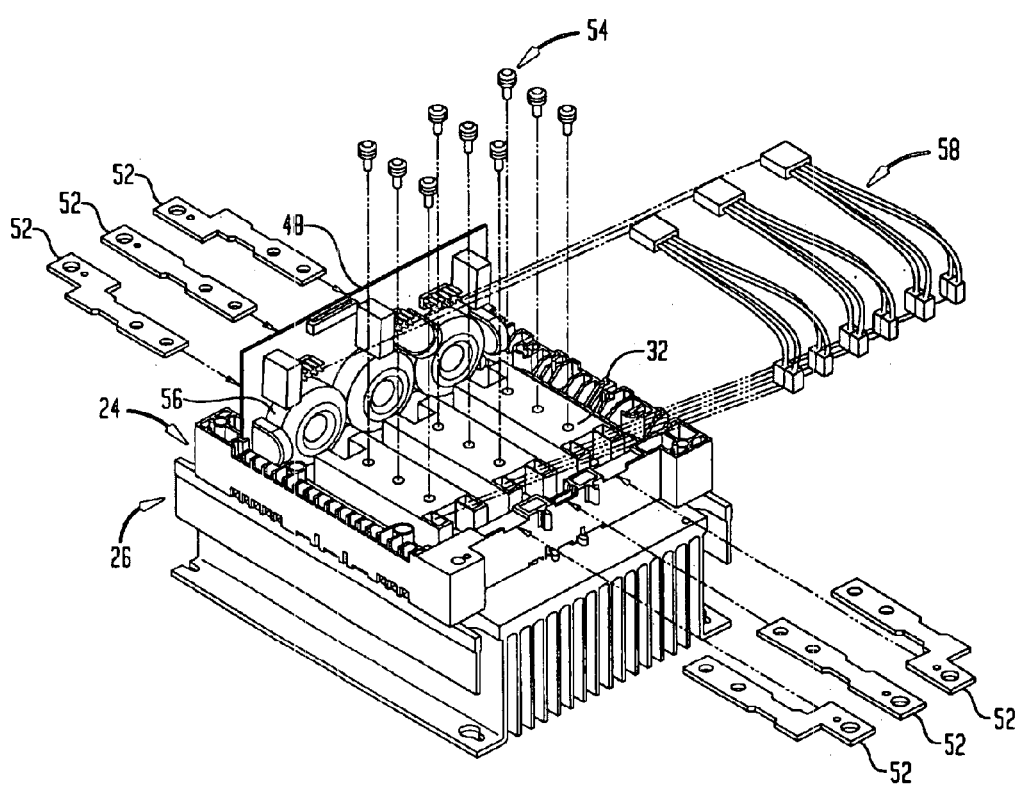

Referring to FIG. 3, the subassembly described above relative to FIG. 2 is illustrated in assembled condition. FIG. 3 further illustrates the assembly of bus bars 52 each of which is secured to one end of one of the SCRs 32 using threaded fasteners 54. Particularly, bus bars 52 at the upper end are fastened directly to the SCRs and are supported on the reversible housing base 24. The bus bars 52 at the lower end are likewise fastened directly to the SCRs 32 and are supported on the housing base 24 after passing through individual current transformers 56 on the interface circuit board 48. Jumper cables 58 connect the three SCRs 32 to the interface circuit board 48.

Figure 4:
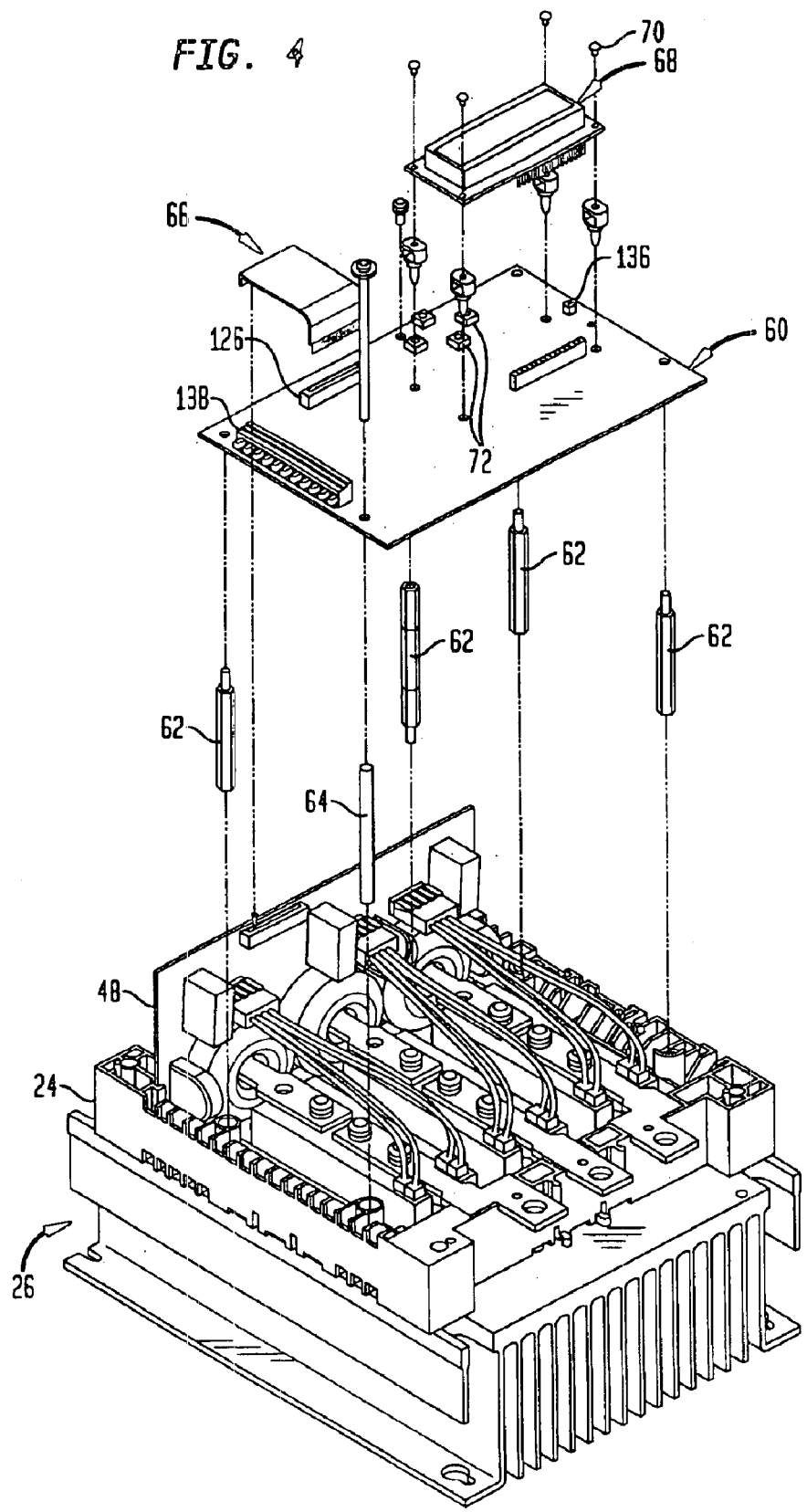

FIG. 4 illustrates the completed subassembly from the assembly procedure described above relative to FIG. 3. FIG. 4 further illustrates a logic circuit board 60 mounted to the reversible housing base 24 via support rods 62. A ground conductor support 64 provides a ground from the logic board 60 to the heat sink 26. A jumper 66 connects the logic circuit board 60 to the interface circuit board 48. An LCD display 68 is connected to the logic circuit board 60 using fasteners 70. The logic circuit board 60 also includes four user actuable switches 72 for configuring operation of logic circuitry installed on the logic circuit board 60, as described below.

Figure 5:
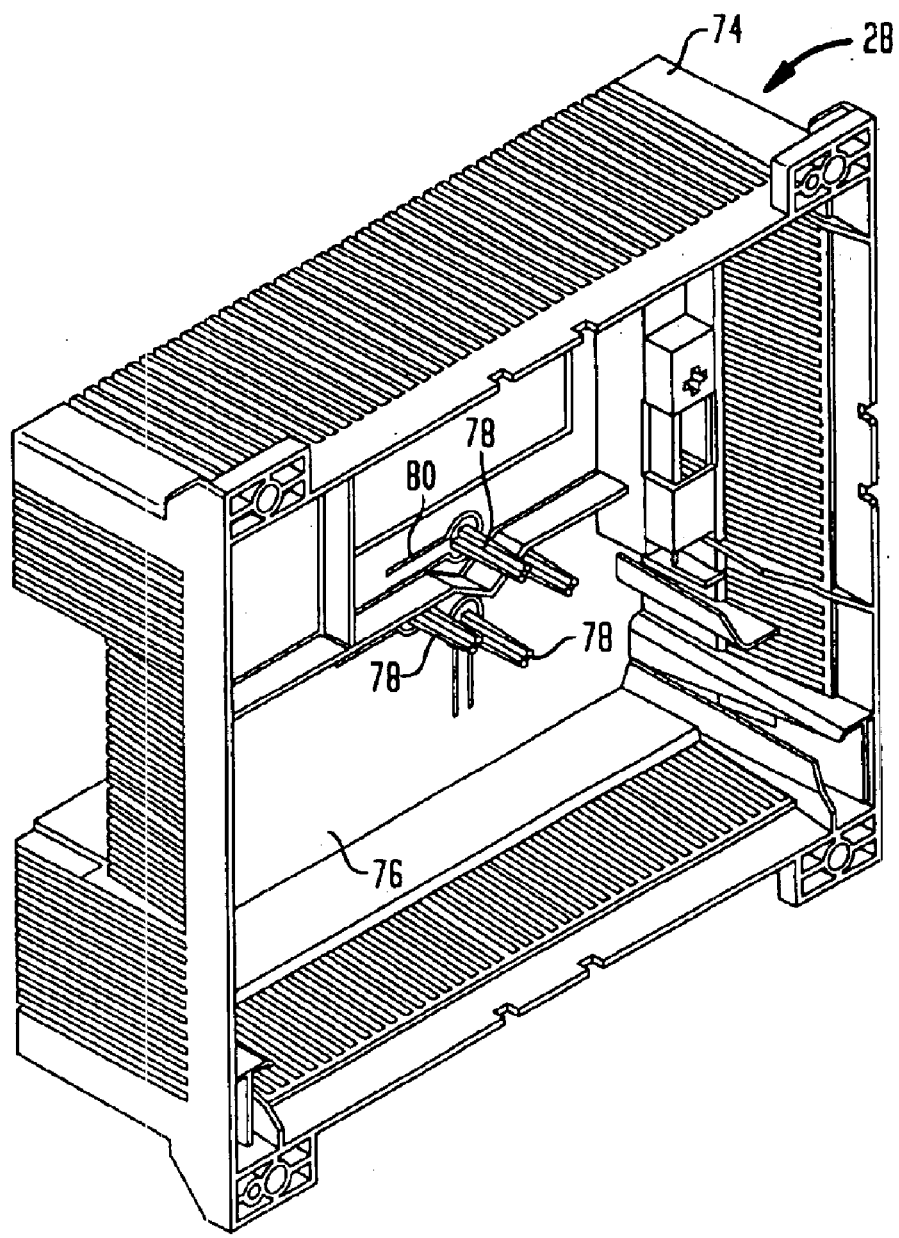
Figure 6:
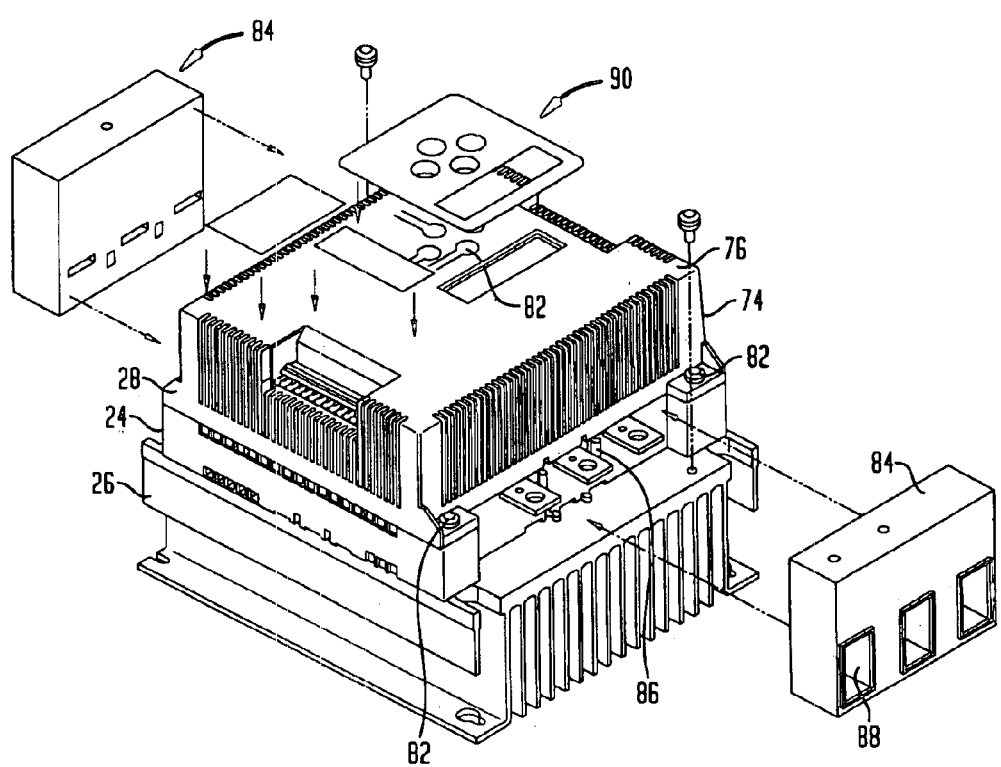

FIG. 5 illustrates a perspective view of the underside of the cover 28. The cover 28 is of one piece molded plastic construction. The cover 28 includes a peripheral sidewall 74 and a top wall 76. Four switch actuator elements 78 extend downwardly from the top wall 76 and the top wall surrounding each has a keyhole slot 80 to define generally circular buttons 82, see FIG. 6. As is apparent, depressing the button 82 causes the actuator 78 to move downwardly. The four actuators 78 are positioned immediately above the logic circuit board switches 72 to actuate the same. The cover 28 and housing base 24 are secured to the heat sink 26 using threaded fasteners 82 as shown in FIG. 6. FIG. 6 also illustrates box terminals 84 which mount to tabs 86 on the housing base 24 and include openings 88 though which the bus bars 52 extend, as generally shown in FIG. 1. A label 90 is secured to the cover top wall 76 overlying the buttons 82.

Figure 7:
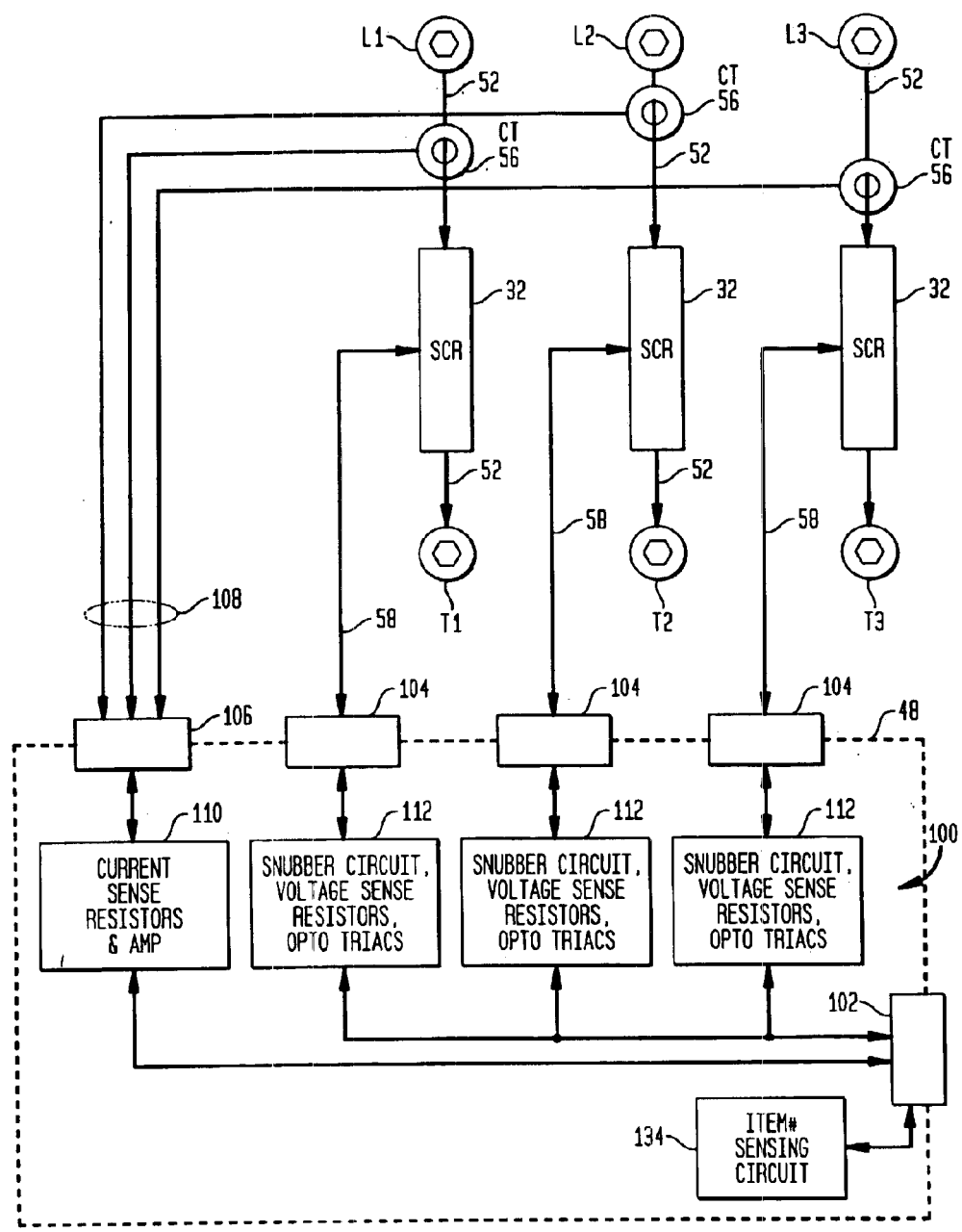
FIG. 7 is a block diagram of an interface circuit of the motor controller of FIG. 1.

Referring to FIG. 7, the interface circuit board 48 includes interface circuitry 100 including a connector 102 for connection via the jumper 66 to the logic board 60. Smaller connectors 104 are provided for connection via the jumpers 58 to the SCRs 32. A further circuit connector 106 receives through pins 108 from the current transformers 56. The SCRs 32 are connected via the bus bars 52 to line terminals L1, L2 and L3 for connection to an AC line and motor terminals T1, T2 and T3 for connection to a motor. The interface circuitry 100 includes a current sense circuit 110 for connection to the current transformers 56 for sensing motor current. The sensed current is provided to the logic circuit board 60. A snubber circuit 112 is provided for each SCR 32. The snubber circuit 112 also includes a voltage sensing circuit and optical isolation for operating the SCRs 32. The snubber circuits 112 may be generally conventional in nature.

In accordance with the invention, the various components used in the snubber circuits 112 vary in size according to the selected size of the SCRs 32. As such, a manufacturer can provide plural different interface circuit boards 48 each including snubber circuits customized to a selected size or sizes of SCRs 32. As such, each interface board 48 is unique to the voltage and current of the SCR 32 being driven.

Figure 8:
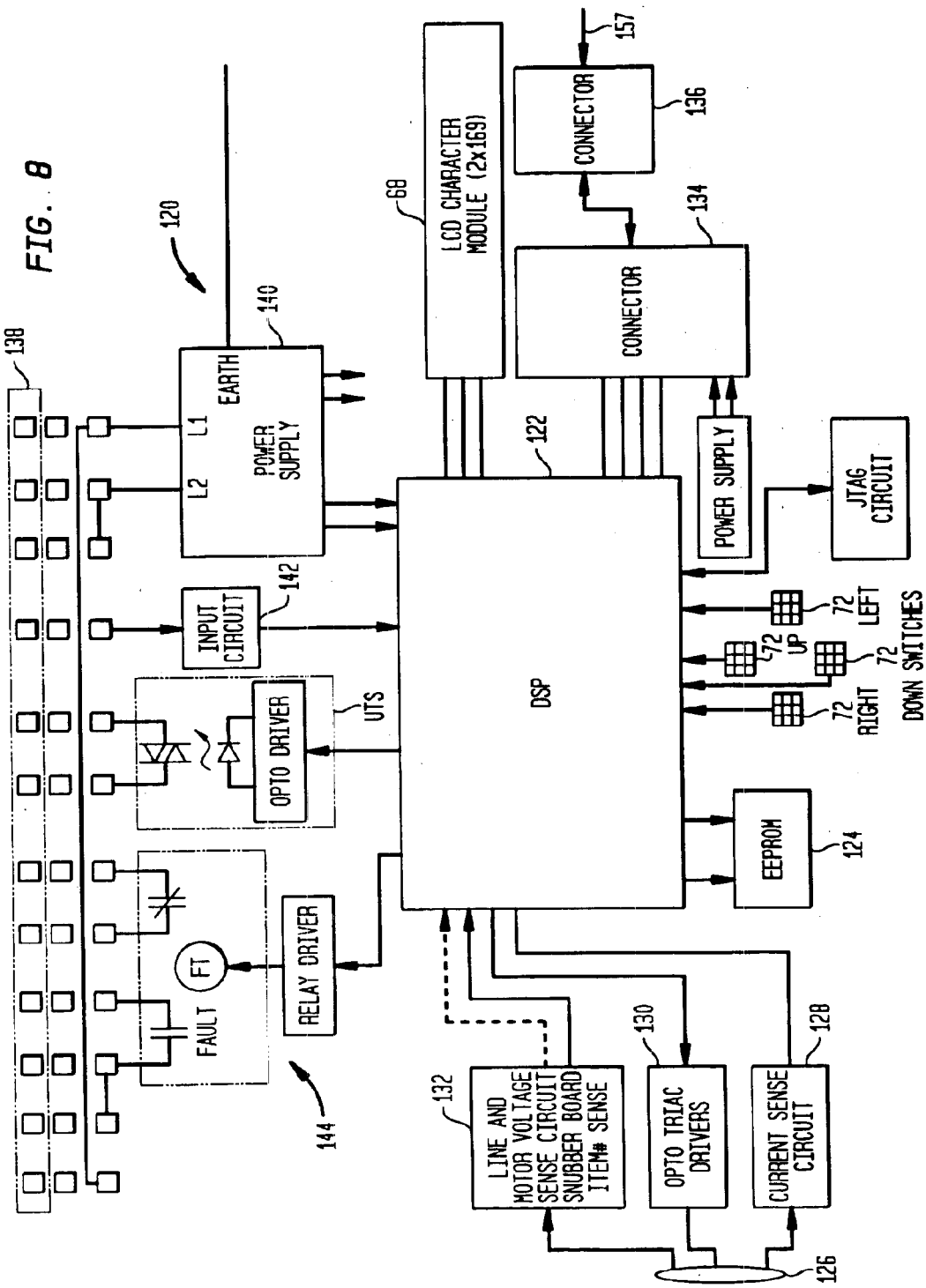
FIG. 8 is a block diagram of a logic circuit of the motor controller of FIG. 1.

Referring to FIG. 8, a block diagram of a logic circuit 120 is illustrated. The logic circuit 120 is provided on the logic circuit board 60 of FIG. 4. The logic circuit 120 includes a digital signal processor (DSP) 122 and associated memory 124. The LCD module 68 is electrically connected to the DSP 122. A connector 126 connects to the interface circuit board 48 via the jumper 66, see FIG. 4. Connected between the connector 126 and the DSP 122 are a current sense circuit 128, electrically connected to the current sense circuit 110 of the interface circle 100, an opto-triac driver circuit 130, for connecting to the snubber circuits 112 of FIG. 7 for driving the SCRs 32, and a voltage sense circuit 132 that connects to the voltage sense circuits of the snubber circuits 112. Additionally, the interface circuit 100 includes an item number sensing circuit 134 which identifies the configuration of the interface circuit board 48. The sense circuit 132 includes circuitry for sensing the item number of the interface circuit board 48 to determine which type of interface board 48 is being used. This is used by the DSP 122 for commanding operation of the SCRs 32 in accordance with current and voltage requirements.

The DSP 122 is also connected to the user actuable switches 72 and via connectors 134 and 136 to a wireless interface module 150 described below. A terminal block 138 is provided for connecting to external devices such as for providing power to the logic circuit 120 and to receive programming information or the like via an input circuit 142 and to provide status information via a relay circuit 144.

In accordance with the invention, the logic circuit 120 is common to different configurations of the motor controller 120 regardless of size of SCRs 32 and the type of interface circuit board 28 being used. Thus, the logic circuit board can be manufactured in larger quantities and at a lower cost. It is particularly cost effective to produce the logic circuit board 60 in higher quantities because the logic circuit board 60 utilizes the more expensive components.

Figure 9:
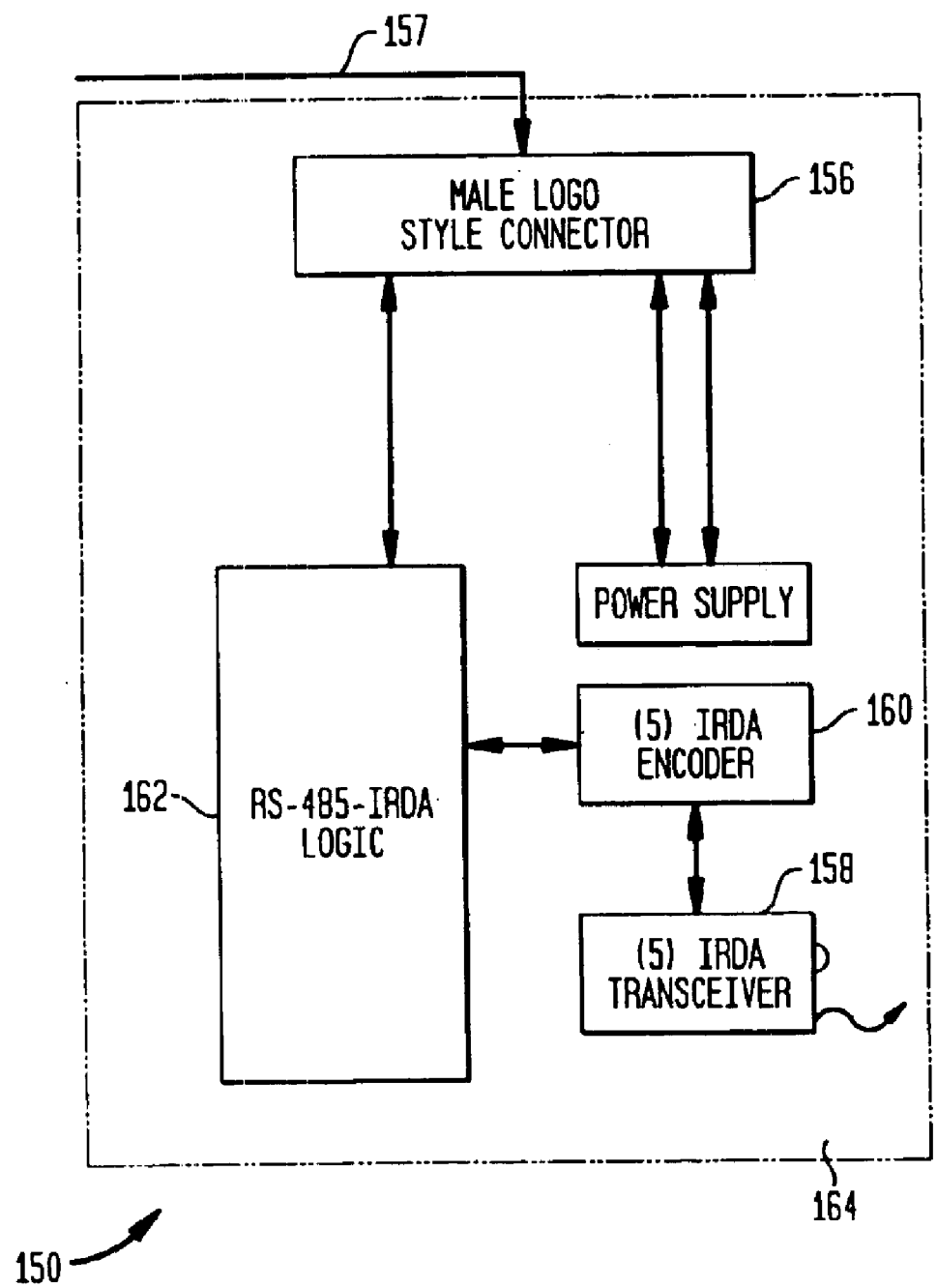
FIG. 9 is a block diagram of a wireless interface module for use with the motor controller of FIG. 1.

Referring to FIG. 9, a block diagram for the wireless interface module 150 is illustrated. In the illustrated embodiment of the invention, the wireless interface module 150 comprises an infrared module. The module 150 is an optional accessory through which a user can communicate with the motor controller 20 using the infrared port of a laptop computer or personal digital assistant (PDA) or the like. The module 150 includes a circuit board 164 supporting a connector 152 for plugging into the logic board connector 136, see FIG. 8, as indicated by the arrow 157 The module 150 also includes an infrared transceiver 158 for wireless communication with an external device. The transceiver 158 is connect to an infrared encoder 160 which is in turn connected to a logic circuit 162.

Figure 10:
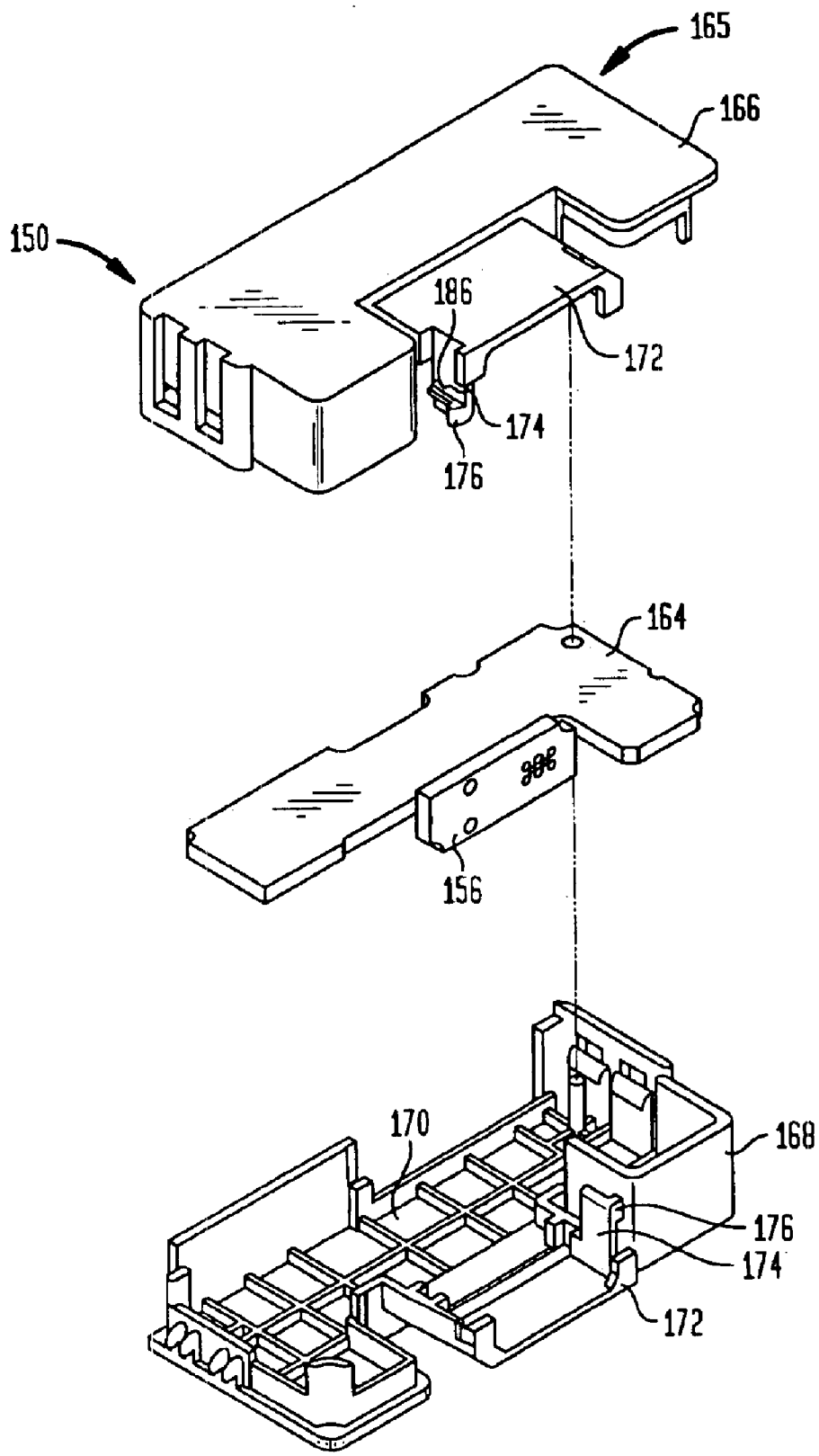
FIG. 10 is an exploded view illustrating assembly of the wireless interface module of FIG. 9.

Referring to FIG. 10, the circuit board 164 is mounted in a housing 165 including a first housing piece 166 and a second housing piece 168. In accordance with the invention, the first housing piece 166 and second housing piece 168 are identical in construction. This reduces tooling costs and doubles part quantities used. The circuit board 164 is generally L shaped. Each housing part 170 is generally E shaped with one half having a perimeter wall and the other half not so that when inverted the two halves 166 and 168 can be matched together. Owing to the E shape of the housing halves 166 and 168 and the L shape of the circuit board 164, the circuit board 164 end can be inserted in either housing half in either direction. The connector 156 is exposed in a middle leg portion 172 of each housing half. The middle leg portion includes an upwardly extending leg 174 on one side having an outwardly extending foot 176.

Figure 11:
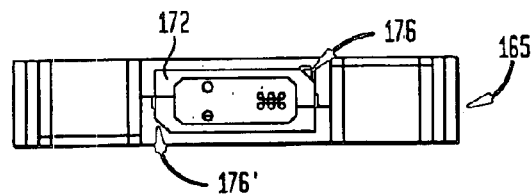
FIG. 11 is a bottom plan view of the wireless interface module of FIG. 9.
Figure 12:
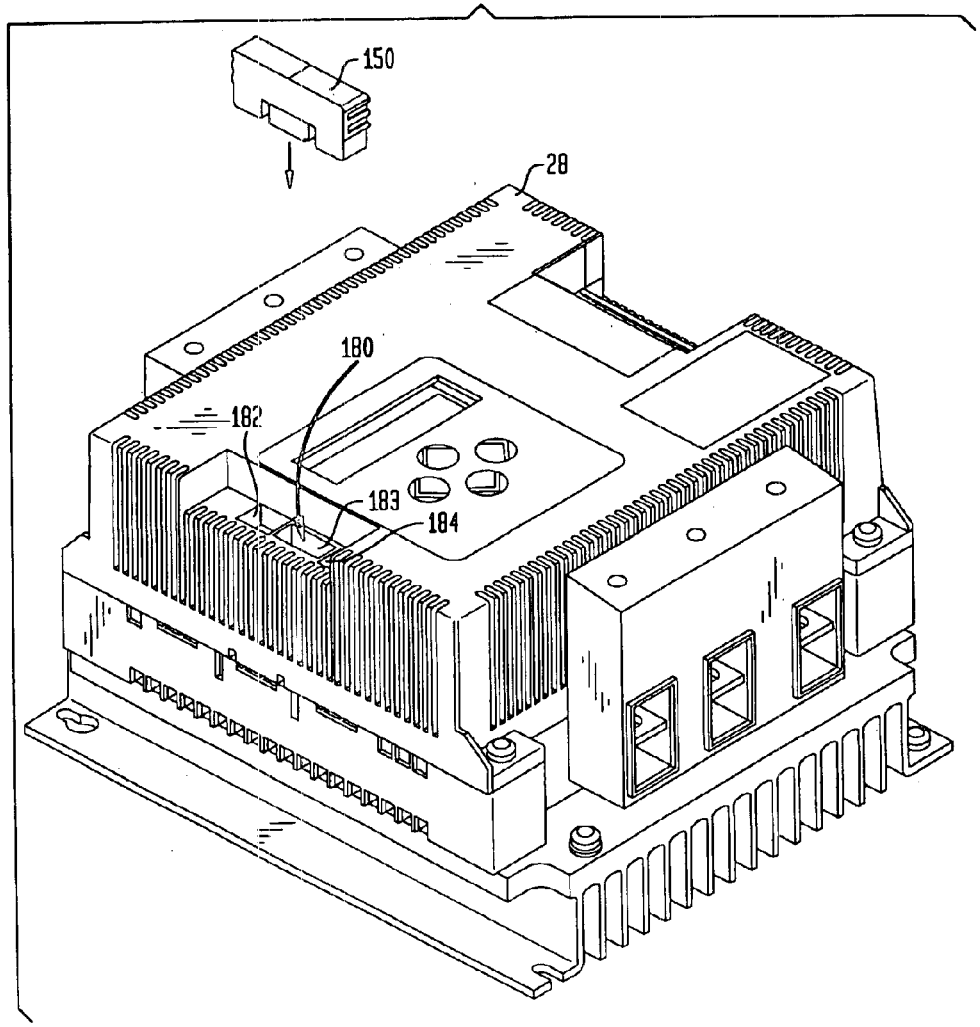
FIG. 12 is an exploded view illustrating installation of the wireless interface module on the motor controller.
Figure 13:
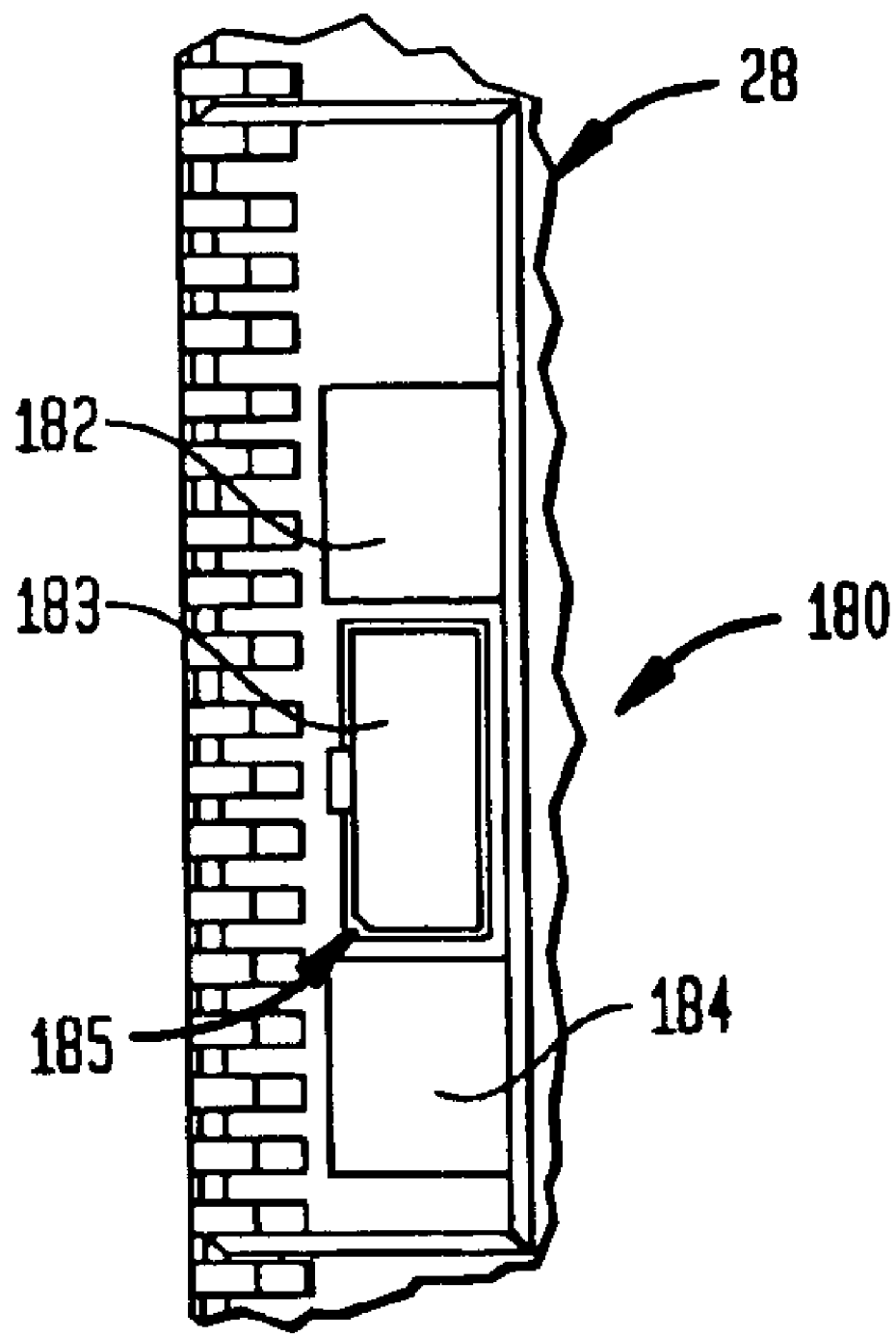
FIG. 13 is a detailed cutaway plan view of the motor controller housing illustrating a port for the wireless interface module.
Figure 14:
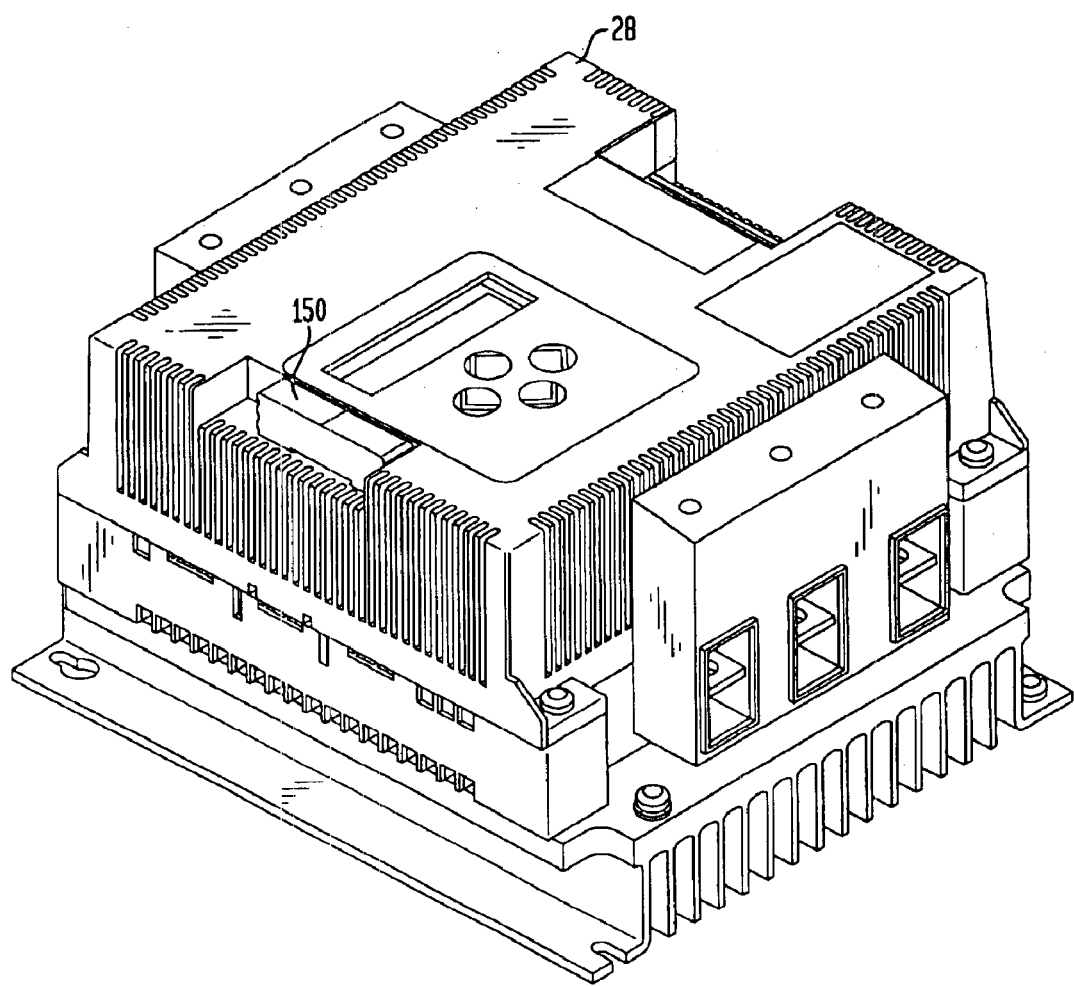
FIG. 14 is a perspective view illustrating the wireless interface module mounted on the motor controller.

Referring to FIGS. 12 and 13, the motor controller cover 28 includes a port 180 for receiving the wireless interface module 150. The port 180 includes three cavities 182, 183 and 184 for receiving the three legs of the E shaped module 150. However, to ensure that the module 150 is inserted correctly, the middle cavity 183 includes a chamfered corner 185. As a result, the foot 176 must be broken off of the leg 174 for one of the housing halves 166 and 168. This is shown generally by the breakline 186 on the housing half 166, in FIG. 10. FIG. 11 shows the middle leg 172 having only one foot 176 and a corner 176' with no tab owing to the broken off foot. This ensures proper orientation of the module 150 when installed in the port 180, as shown in FIG. 14.

The disclosed improvements in the design of the motor controller 20 can reduce manufacturing costs and decrease inventory requirements.

It can therefore be appreciated that a new and novel system and method for improving a motor controller design has been described. It will be appreciated by those skilled in the art that, given the teachings herein, that numerous alternatives and equivalents will be seen to exist which incorporate the disclosed invention. As a result, the invention is not to be limited by the foregoing exemplary embodiments, but on by the following claims.

I claim:

1. A motor controller comprising:
   solid state switches for connection between an AC line and motor terminals for controlling application of AC power to the motor;
   a unitary heat sink including a plate mounting the solid state switches, a plurality of fins having a select length extending downwardly from the plate, and continuous mounting feet extending outwardly from lower edges of outermost ones of the fins and extending the select length of the fins for mounting the motor controller directly to an external control panel, in use; and a housing mounted to the heat sink for enclosing the solid state switches.

2. The motor controller of claim 1 wherein the heat sink comprises an extruded aluminum heat sink.

3. The motor controller of claim 1 wherein the mounting feet include a notch at one end and a key shaped opening at another end for mounting to an external control panel.

4. The motor controller of claim 1 wherein the heat sink includes a plurality of parallel fins extending perpendicular from the plate opposite the solid state switches.

5. The motor controller of claim 1 wherein the plate has outer edges overlying outer edges of the mounting feet.

6. The motor controller of claim 5 further comprising shorter fins extending downwardly from the outer edges of the plate.

7. A motor controller comprising:

solid state switches for connection between an AC line and motor terminals for controlling application of AC power to the motor;

a one piece heat sink including a plate having a top surface and a bottom surface, the top surface mounting the solid state switches, a plurality of equally spaced parallel fins having a select height and length extending downwardly from the bottom surface, and continuous mounting feet extending outwardly from lower edges of outermost ones of the fins and extending the select length of the fins for mounting the motor controller directly to an external control panel, in use; and a housing mounted to the heat sink for enclosing the solid state switches.

8. The motor controller of claim 7 wherein the heat sink comprises an extruded aluminum heat sink.

9. The motor controller of claim 7 wherein the mounting feet include a notch at one end and a key shaped opening at another end for mounting to an external control panel.

10. The motor controller of claim 7 wherein the plate has outer edges overlying outer edges of the mounting feet.

11. The motor controller of claim 10 further comprising shorter fins extending downwardly from the outer edges of the plate.

\* \* \* \* \*